(12) United States Patent
Koh et al.

(10) Patent No.: US 8,095,102 B2
(45) Date of Patent: Jan. 10, 2012

(54) PHASE-LOCK LOOP

(75) Inventors: Chin Yeong Koh, Singapore (SG); Kar Ming Yong, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 526 days.

(21) Appl. No.: 12/272,152

(22) Filed: Nov. 17, 2008

(65) Prior Publication Data

US 2010/0124894 A1    May 20, 2010

(51) Int. Cl.
*H03L 7/087*    (2006.01)
*H03L 7/085*    (2006.01)

(52) U.S. Cl. ..... 455/264; 327/48; 327/156; 331/DIG. 2; 329/325

(58) Field of Classification Search .......... None
See application file for complete search history.

(56) References Cited

U.S. PATENT DOCUMENTS

| | | | | |
|---|---|---|---|---|
| 6,329,850 | B1 * | 12/2001 | Mair et al. | 327/107 |
| 6,937,685 | B2 * | 8/2005 | Tang | 375/376 |
| 7,372,340 | B2 * | 5/2008 | Xiu et al. | 331/45 |
| 7,492,850 | B2 * | 2/2009 | Menolfi et al. | 375/376 |
| 7,496,168 | B2 * | 2/2009 | Leonowich et al. | 375/376 |

* cited by examiner

*Primary Examiner* — Lincoln Donovan
*Assistant Examiner* — Terry L Englund
(74) *Attorney, Agent, or Firm* — SprylP, LLC

(57) ABSTRACT

In one implementation an output signal of an oscillator is varied to be within a desired frequency band with respect to a reference signal, the output signal having a plurality of phases. The implementation may include comparing the output signal with the reference signal, counting falling edges about each phase of the number of phases in a predetermined time period and summing to define a count output; comparing the count output with a product of the number of phases of the output signal and the factor to define a comparison, generating a control signal based upon the comparison, and inputting the control signal to the oscillator to alter the output signal thereof.

22 Claims, 4 Drawing Sheets

PHASE-LOCK LOOP

BACKGROUND

Voltage controlled oscillators (VCOS) are commonly employed in a variety of applications, including communication and timing circuitry. In particular, VCOs are commonly used in phase-locked loop (PLL) control systems. Functionally, a VCO may be viewed as a circuit that seeks to transform an input control voltage signal to an output voltage signal having a desired frequency.

In this case, following a frequency division of the output voltage signal, a phase/frequency detector is normally used to compare an output signal of an oscillator with a reference signal, and a loop filter is used to tune the VCO in a manner dependent on the phase/frequency comparison such that the output signal "matches" the reference signal. Such PLLs are usually used to synthesize signals at a desired frequency or, for example, to recover a clock signal from a data stream. PLLs can also be advantageously used in mobile radio for the purposes of signal modulation.

However, having the reference signal and the feedback signal close to one another may lead to long frequency locking time. To that end, it may be desired to provide an improved digital PLL.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

The present disclosure describes a phase-lock loop. Many specific details are set forth in the following description and in FIGS. 1-4 to provide a thorough understanding of various embodiments. One skilled in the art will understand, however, that the subject matter described herein may have additional embodiments, or that the concepts set forth may be practiced without several of the details described in the following description.

The phase-lock loop of the present disclosure compares an output signal thereof with a reference signal by a frequency detector and alters a control signal in response thereto such that the output signal, dependent upon the control signal, may have a desired frequency, i.e. within a desired frequency band of the reference signal. As such, the phase-lock loop has improved frequency locking time. The phase-lock loop may comprise multiple frequency counters to reduce the frequency locking time. The phase-lock loop may be used in a number of contexts such as radio devices, telecommunications devices, wireless devices, networking devices, computers, and other electronic applications.

Figure 1:
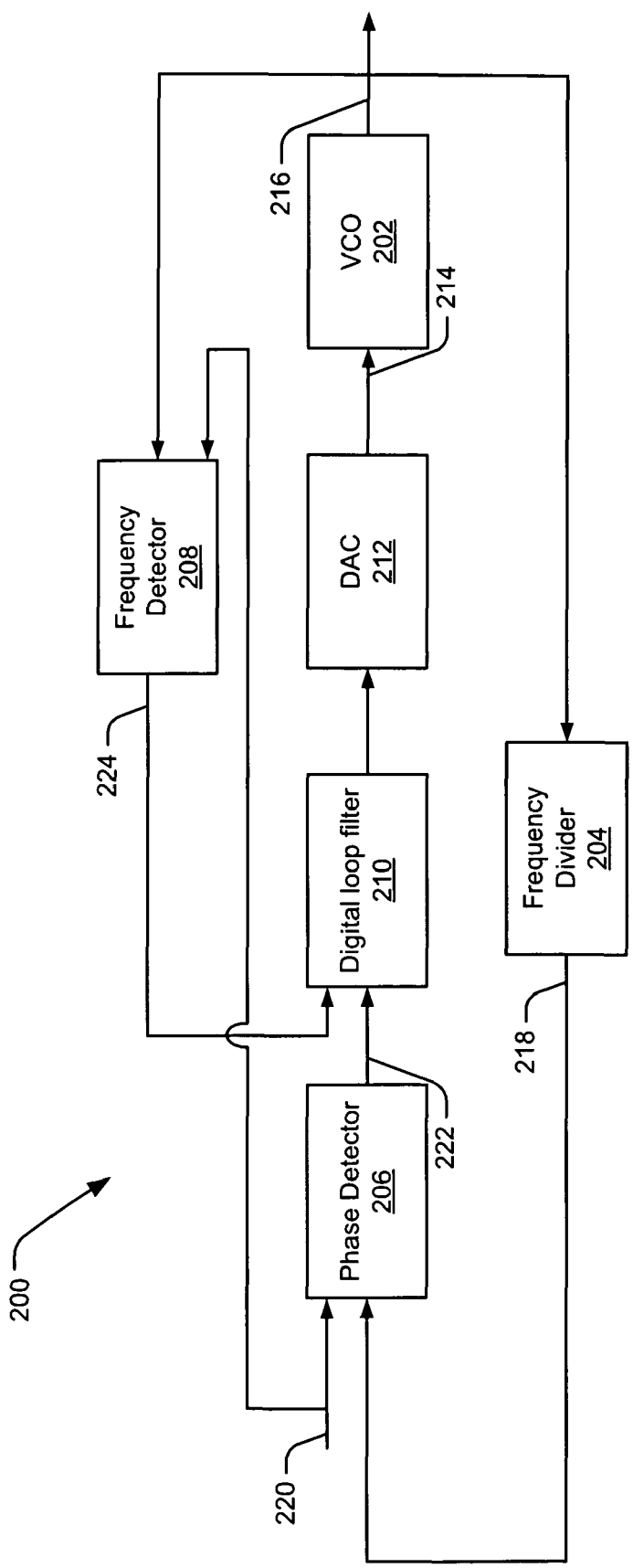
FIG. 1 shows a block diagram of a phase-lock loop according to one implementation.

FIG. 1 shows a PLL 200. The PLL 200 comprises a VCO 202, a frequency divider 204, a phase detector 206, a frequency detector 208, a loop filter 210, and a digital-to-analog converter (DAC) 212. The loop filter 210 may be a digital loop filter. The VCO 202 receives a control signal 214 and generates an output signal 216 that simultaneously forms the output of the PLL 200. The output signal 216 is controlled by, and its frequency dependent on, the control signal 214. As a result, the output signal 216 of the VCO 202 may be controlled to be within a desired frequency band, described further below. In an example, the output signal 216 may operate in a frequency band of 200 Mhz-400 Mhz, however, any frequency band may be employed as desired based upon the application of the PLL 200.

The output signal 216 of the VCO 202 is fed as an input signal to the frequency divider 204. The frequency divider 204 reduces the frequency of the output signal 216 by a divisor N, producing a divided signal 218, that is fed as an input signal to the phase detector 206. The magnitude of N is determined by the application desired by a user of the PLL 200 and may vary thereupon. A reference signal 220 is fed as a further input signal to the phase detector 206. The phase detector 206 compares the divided signal 218 with the reference signal 220 and generates an output signal 222 that indicates the relative phase difference therebetween. In an example, the phase detector 206 may be a bang bang phase detector, which is commonly known in the art.

The output signal 216 of the VCO 202 is fed as an input signal to the frequency detector 208. The reference signal 220 is also supplied to a further input signal to the frequency detector 208. The frequency detector 208 compares the output signal 216 with the reference signal 220 and generates an output signal 224 that indicates the relative frequency difference therebetween, described further below. In an implementation, the frequency detector 208 counts the number of clock edges of the output signal 216 within one period of the reference signal 220. In a further embodiment, the output signal 216 comprises multiple phases. As a result, the frequency detector 208 compares multiple phases of the output signal 216 with the reference signal 220, described further below.

The output signal 224 of the frequency detector 208 and the output signal 222 of the phase detector 206 are fed as input signals to the loop filter 210. The loop filter 210 produces the control signal 214 via the DAC 212 that is fed as an input signal to the VCO 202. As a result, the loop filter 210 controls the output of the PLL 200 such that a frequency of the PLL 200 is "locked" to the reference signal 220, i.e., the frequency of the output signal 216 of the VCO 202 is moved closer to the reference signal 220 such that the output signal 216 is within a desired frequency band of the reference signal 220. Further, a frequency of the output signal 216 is the frequency of the reference signal 220 multiplied by divisor N of the frequency divider 204.

To that end, one exemplary feature of the PLL 200 is that the output signal 216 of the VCO 202 is immediately compared to the reference signal 220 by the frequency detector 208 within each reference clock period. This makes it possible to measure the VCO 202 directly and thus in a highly precise and, at the same time, very rapid manner.

More specifically, as mentioned above, the frequency detector 208 compares multiple phases (M number of phases) of the output signal 216 with the reference signal 220. In the present example, the frequency detector 208 compares two phases of the output signal 216 with the reference signal 220. However, in a further embodiment, the frequency detector 208 compares any number of phases that the output signal 216 comprises with the reference signal 220.

Figure 2:
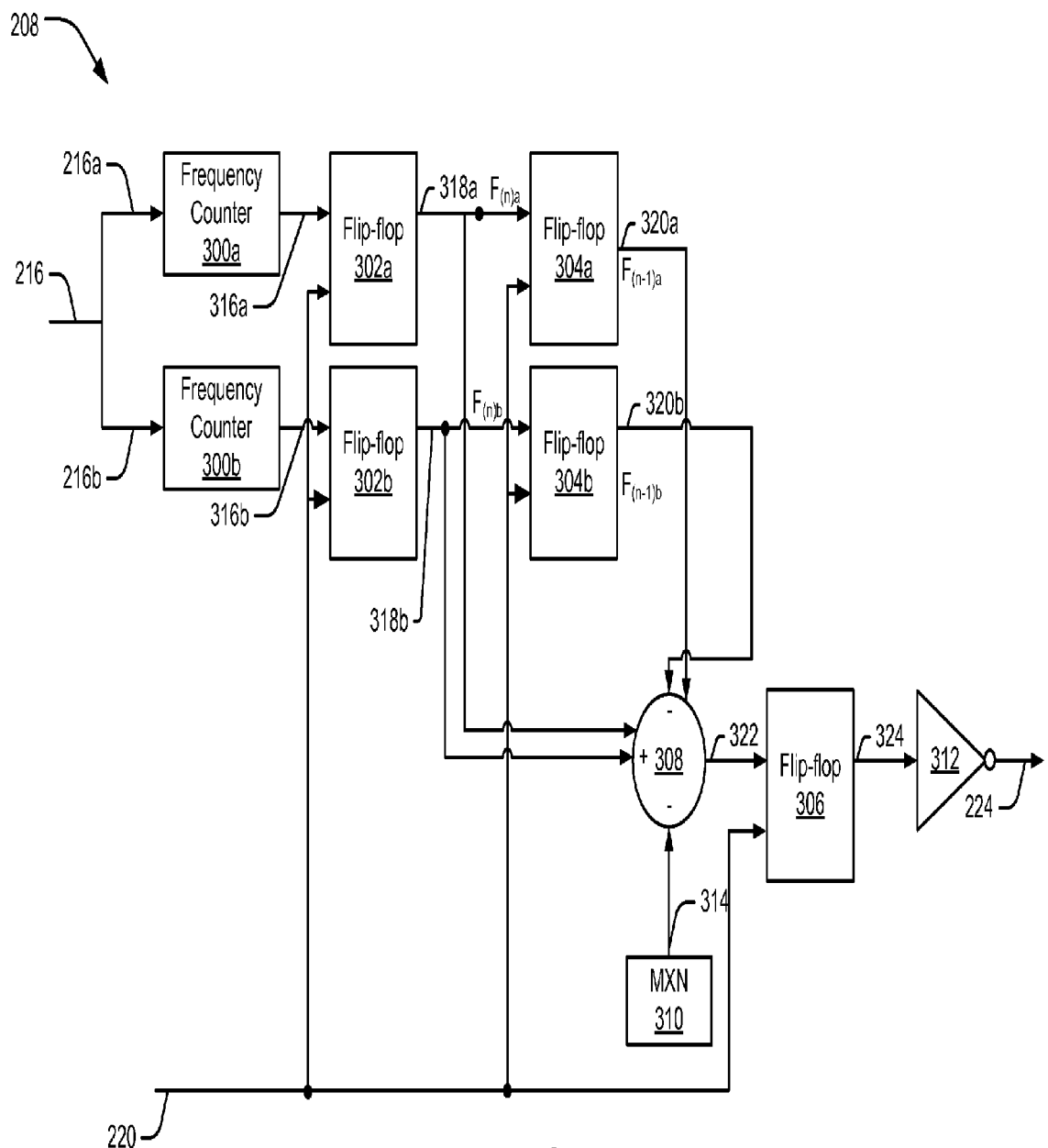
FIG. 2 shows a block diagram of a frequency detector employed in the phase-lock loop of FIG. 1.

FIG. 2 shows the frequency detector 208 in more detail. In the illustrated implementation, the frequency detector 208 includes frequency counters 300a and 300b; flip-flops 302a, 302b, 304a, 304b, and 306; an adder/subtractor 308; a multiplier 310; and an inverter 312. The flip-flops 302a, 302b, 304a, 304b, and 306 are implemented as D flip-flops, which are commonly known in the art, having a clock input D and an output Q. The clock input of the individual flip-flops 302a, 302b, 304a, 304b, and 306 are connected to the reference signal 220. The multiplier 310 generates an output 314 having a value of the product of M (the number of phases of the output signal 216) and N (the divisor of the frequency divider 204, shown in FIG. 1).

As mentioned above, the output signal 216 of the VCO 202 is fed as an input to the frequency detector 208. More specifically, the output signal 216 of the VCO 202 is fed as an input to the frequency counters 300a and 300b. The output signal 216 shown as output signals 216a and 216b, each having a differing phase associated therewith. In an example, the phase associated with the output signal 216a has a value of 0° and the phase associated with the output signal 216b has a value of 180°. However, in a further embodiment, the output signals 216a and 216b may have any phase associated therewith. The frequency counters 300a and 300b determine a number of falling edges in the output signals 216a and 216b, respectively, within a reference clock period to produce the count output signals 316a and 316b, respectively. In the present example, the reference clock period may be a predetermined number of periods of the reference signal 220, i.e., 1 period of the reference signal 220. At every falling edge of the output signals 216a and 216b, the frequency counters 300a and 300b increases the count output signals 316a and 316b, respectively, by 1 until a maximum count (MaxCountA and Max-CountB) allowed by the frequency counters 300a and 300b is reached. Subsequently, the count output signals 316a and/or 316b are cycled back to an initial value of 1. The maximum count of the frequency counters 300a and 300b is limited by the number of bits that is associated therewith. The frequency counters 300a and 300b may be any digital counter known in the art.

The count output signals 316a and 316b are fed to input D of the flip-flops 302a and 302b, respectively, with the flip-flops 302a and 302b generating the output signals 318a and 318b. The output signals 318a and 318b are fed to input D of the flip-flops 304a and 304b, respectively, with the flip-flops 304a and 304b generating the output signals 320a and 320b, respectively. The frequency at the output signals 318a and 318b are identified as $F_{(n)a}$ and $F_{(n)b}$, respectively, and the frequency at the output signals 320a and 320b are identified as $F_{(n-1)a}$ and $F_{(n-1)b}$, respectively. $F_{(n)a}$ and $F_{(n)b}$ are the count totals for the output signals 216a and 216b, respectively, at the current clock edge of the reference signal 220, i.e., at time $t_n$; and $F_{(n-1)a}$ and $F_{(n-1)b}$ are the count totals for the output signals 216a and 216b, respectively, at the previous clock edge of the reference signal 220, i.e., at time $t_{n-1}$.

To that end, the output signals 318a, 318b, 320a, and 320b are fed as input signals to the adder/subtractor 308. Further, the output signal 314 of the multiplier 310 is fed as a further input signal to the adder/subtractor 308. The adder/subtractor 308 performs mathematical operations, described below, on the signals 318a, 318b, 320a, 320b, and 314 to generate the output signal 322. The output signal 322 is calculated depending on the magnitudes of $t_n$ and $t_{n-1}$.

Figure 3:
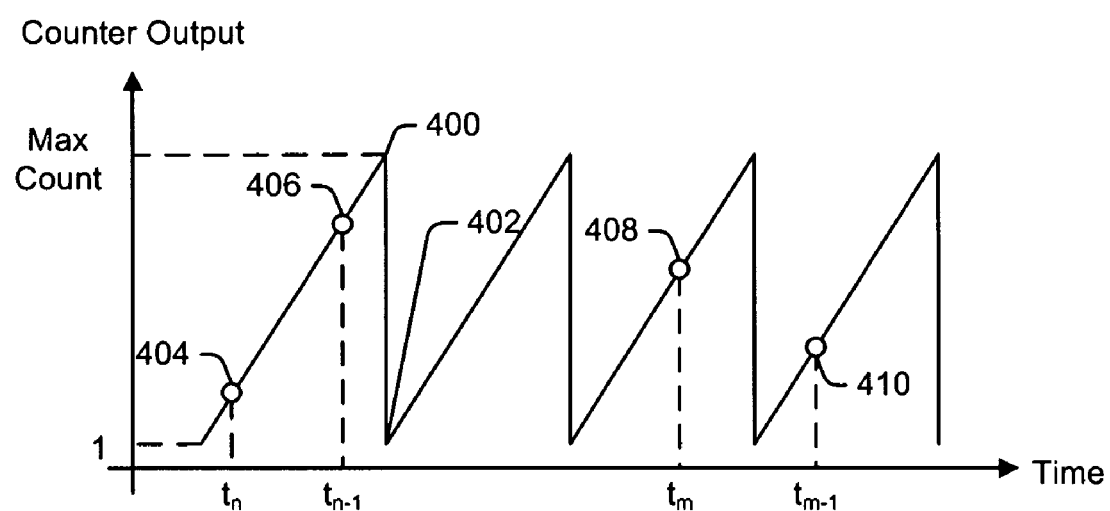
FIG. 3 shows a graph of a counting scheme employed in the phase-lock loop of FIG. 2.

FIG. 3 illustrates a graph of the count output signal 316a (or 316b) versus time for the frequency counter 300a (or 300b). As mentioned above, the frequency counter 300a (or 300b) increases the count output signal 316a (or 316b) by 1 until a maximum count allowed by the frequency counter 300a (or 300b) is reached (shown as point 400), and then cycled back to the initial value of 1 (shown as point 402). To that end, depending upon the magnitude of $t_n$ and $t_{n-1}$, $t_n$ and $t_{n-1}$ may lay in the same slope, i.e. the same count cycle (shown at points 404 and 406) or may lay in differing slopes, i.e., differing count cycles (shown at points 408 and 410 and at times $t_m$ and $t_{m-1}$).

Method 1—$t_n$ and $t_{n-1}$ Laying in the Same Count Cycle

Where $t_n$ and $t_{n-1}$ lay in the same slope, i.e., the same count cycle, the frequency at the output signal 322 ($F'_{count}$) may be calculated via the formula:

$$F'_{count}=F_{(n)a}+F_{(n)b}-F_{(n-1)a}-F_{(n-1)b}-(M\times N) \quad (1)$$

Method 2—$t_n$ and $t_{n-1}$ Laying in Different Count Cycles

Where $t_n$ and $t_{n-1}$ (shown as $t_m$ and $t_{m-1}$) lay in differing slopes, i.e., differing cycle counts, the frequency at the output signal 322 ($F'_{count}$) may be calculated via the formula:

$$F'_{count}=\text{MaxCount}A+\text{MaxCount}B+F_{(n)a}+F_{(n)b}-F_{(n-1)a}-F_{(n-1)b}-(M\times N) \quad (2)$$

In either of Method 1 or Method 2 mentioned above, the output signal 322 is fed to D input of the flip-flop 306, generating the output signal 324. The output signal 324 is inverted by the inverter 312, generating the output signal 224. The frequency at the output signal 224 is identified as $F_{count}$ and may be calculated via the formula:

$$F_{count}=F'_{count}\times -1 \quad (3)$$

Referring to FIG. 1, as mentioned above, the output signal 224 of the frequency detector 208 is fed as an input to the loop filter 210. To that end, if $F_{count}$ is greater than the product of the number M of phases of the output signal 216 and the factor N, a negative value is supplied to the loop filter 210 via the output signal 224. However, if $F_{count}$ is less than the product of the number M of phases of the output signal 218 and the factor N, a positive value is supplied to the loop filter 210 via the output signal 224. The loop filter 210 varies the control signal 214 such that the output signal 216 is within a desired frequency band with respect to the reference signal 220. If a negative value is supplied to the loop filter 210, the loop filter 210 may decrease the output signal 216 via the control signal 214. If a positive value is supplied to the loop filter 210, the loop filter 210 may increase the output signal 216 via the control signal 214.

Furthermore, as mentioned above, the output signal 216 comprises a number M of phases. To that end, depending on the magnitude of M, the components of the frequency detector 208 are altered and/or increased. More specifically, the number Y of the frequency counters 300 is the same as the number M of phases of the output signal 216. Further, the number X of the sets of flip-flops 302 and 304 connected in series with the frequency counters 300 is twice the number M of phases. As a result, the frequency detector 208 and the PLL 200 may be scaled to accommodate any number M of phases of the output signal 216 as determined by the application desired.

In a further example, the output signal 216 of the VCO 202 has 3 phases associated therewith. To that end, the frequency detector 208 comprises 3 frequency counters each having 2 sets of flip-flops associated therewith. Further, for Method 1 described above, the equation becomes:

$$F'_{count}=F_{(n)a}+F_{(n)b}+F_{(n)c}-F_{(n-1)a}-F_{(n-1)b}-F_{(n-1)c}-(M\times N) \quad (4)$$

For Method 2 described above, the equation becomes:

$$F'_{count}=\text{MaxCount}A+\text{MaxCount}B+\text{MaxCount}C+F_{(n)a}+F_{(n)b}+F_{(n)c}-F_{(n-1)a}-F_{(n-1)b}-F_{(n-1)c}(M\times N) \quad (2)$$

Also, as a result of the PLL 200, and more specifically, the frequency detector 208, employing multiple frequency counters 300, the frequency locking time of the PLL 200 is minimized, which is desired. The resolution of the PLL 200 is increased by the number Y of the frequency counters 300 employed in PLL 200. In an example, were the PLL 200 to comprise 4 frequency counters 300, the resolution of the PLL 200 is increased 4 times as compared to the PLL 200 comprising a single phase frequency counter 300. Further, the PLL 200 has a frequency sensitivity of up to ¼ period of the output signal 216. The remaining ¼ period clock error is eliminated or minimized by the phase detector 206. Furthermore, to minimize power consumption by the PLL 200, after achieving "lock" status of the output signal 216 to the reference signal 220, all but one of the frequency counters 300 employed in the PLL 200 is disabled.

Figure 4:
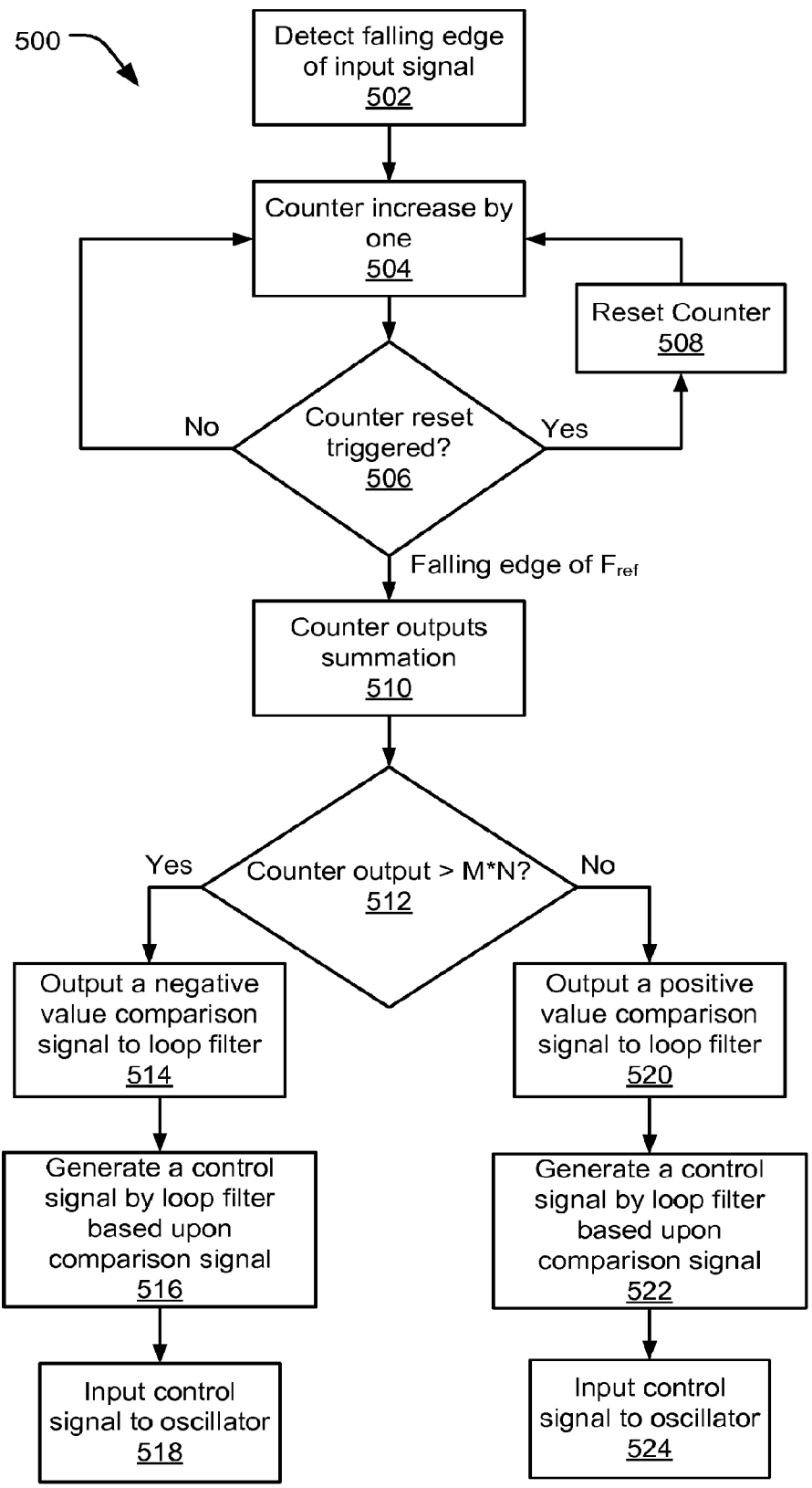
FIG. 4 shows a process flow chart employing a frequency counter employed in the phase-lock loop of FIG. 1.

FIG. 4 shows a process 500 of counting frequency edges for each phase of the output signal 216 as employed, for example, by the frequency counter 300a (or 300b) in FIG. 2. The process 500 is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in other orders and/or in parallel to implement the process.

At 502, a falling edge of the output signal 216a (or 216b) is detected. At 504, the count output signal 316a (or 316b) is increased by 1. At 506, a determination is made if a maximum count MaxCountA (or MaxCountB) is reached. If the maximum count has not been reached (and if a falling edge of the reference signal 220 has not been detected), the process is looped back to step 504. If the maximum count has been reached (and if a falling edge of the reference signal 220 has not been detected), the count output signal 316a (or 316b) is cycled back to 1 at 508 and then looped back to 504. If a falling edge of the reference signal 220 has been detected, at 510, the frequency counter 300a (or 300b) outputs the count output 316a (or 316b) to the adder/subtractor 308. At step 512, a determination is made if the count output signal 316a (or 316b) is greater than the product of the number M of phases of the output signal 216a (or 216b) and the factor N. If the count output 316a (or 316b) is greater than the product of the number M of phases of the output signal 216a (or 216b) and the factor N, then at step 514, a negative value comparison signal is supplied to the loop filter 210 via the output signal 224. At step 516, the control signal 214 is generated by the loop filter 210 based upon the comparison signal. At step 518, the control signal 214 is input to the VCO 202. However, if the count output signal 316a (or 316b) is not greater than the product of the number M of phases of the output signal 216a (or 216b) and the factor N, than at step 520, a positive value is supplied to the loop filter 210 via the output signal 224. At step 522, the control signal 214 is generated by the loop filter 210 based upon the comparison signal. At step 524, the control signal 214 is input to the VCO 202

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method of varying an output signal of an oscillator to be within a desired frequency band with respect to a reference signal, the output signal having a plurality of phases, the method comprising:
for each phase of the plurality of phases:
detecting a falling edge of the output signal;
increasing a count for each falling edge detected;
detecting a falling edge of the reference signal;
summing the count for each phase of the plurality of phases, defining a count summation; and
comparing the count summation with a product of a number of phases of the output signal and a factor that the output signal may be divided down by, defining a comparison signal;
outputting the comparison signal to a loop filter;
generating a control signal by the loop filter based upon the comparison signal; and
inputting the control signal to the oscillator, with the control signal altering the output signal such that the output signal is within the desired frequency band with respect to the reference signal.

2. The method as recited in claim 1, wherein increasing the count further comprises resetting a counter upon obtaining a maximum value of the counter.

3. The method as recited in claim 1, wherein outputting the comparison signal further comprises the comparison signal being positive if the count summation is less than the product.

4. The method as recited in claim 1, wherein outputting the comparison signal further comprises the comparison signal being negative if the count summation is greater than the product.

5. The method as recited in claim 1, further comprising converting the control signal from a digital signal to an analog signal, wherein the converted control signal is input to the oscillator.

6. The method as recited in claim 1, further comprising dividing down a frequency of the output signal by the factor, defining a divided down signal, and comparing a phase of the divided down signal and the reference signal.

7. A phase-lock loop, comprising:
an oscillator to receive a control signal and generate an output signal having a plurality of phases;
a frequency detector coupled to receive the output signal of the oscillator and further coupled to receive a reference signal, and for each phase, the frequency detector configured to:
detect a falling edge of the output signal;
increase a count for each falling edge detected;
detect a falling edge of the reference signal;
sum the count for each phase of the plurality of phases, defining a count summation; and
compare the count summation with a product of a number of phases of the output signal and a factor that the output signal may be divided down by, defining a comparison signal; and
a loop filter coupled to receive the comparison signal and configured to generate the control signal based upon the comparison signal, with the control signal altering the output signal such that the output signal is within a desired frequency band with respect to the reference signal.

8. The phase-lock loop as recited in claim 7, further comprising a frequency divider coupled to receive the output signal of the oscillator and being configured to divide down a frequency of the output signal of the oscillator by the factor, defining a divided down signal.

9. The phase-lock loop as recited in claim 8, further comprising a phase detector coupled to receive the divided down signal and further coupled to receive the reference signal, and configured to generate an output signal based on a comparison of the phases of the divided down signal and the reference signal, with the output of the phase detector coupled to a further input of the loop filter.

10. The phase-lock loop as recited in claim 7, further comprising a digital-to-analog converter configured to convert the control signal from a digital signal to an analog signal, wherein the converted signal is received by the oscillator.

11. The phase-lock loop as recited in claim 7, wherein the frequency detector comprises a plurality of frequency counters to count the falling edges of each phase of the plurality of phases.

12. The phase-lock loop as recited in claim 7, wherein the frequency detector comprises an adder/subtractor to compare the count summation with the product.

13. A wireless device comprising the phase-lock loop of claim 7.

14. A phase-lock loop, comprising:
an oscillator to receive a control signal and generate an output signal having a plurality of phases;
a frequency detector coupled to receive the output signal of the oscillator and further coupled to receive a reference signal, the frequency detector comprising:
a plurality of frequency counters each receiving a differing phase of the output signal of the oscillator, each frequency counter configured to count falling edges about the phase associated therewith in a predetermined time period and generate a count output signal;
a plurality of first and second flip-flops, with each frequency counter having corresponding first and second flip-flops of the plurality of flip-flops coupled thereto such that the first flip-flop receives the count output signal and generates a first output signal at the current edge of the reference signal, and the second flip-flop receives the first output signal and generates a second output signal at the previous clock edge of the reference signal;
an adder/subtractor receiving each first output signal and each second output signal associated with the plurality of first and second flip-flops and a signal corresponding to a product of a number of phases of the output signal of the oscillator and a factor that the output signal of the oscillator is divided down by and generating an output signal of the frequency detector based upon a comparison of the input signals; and
a loop filter coupled to receive the output signal of the frequency detector, and configured to generate the control signal based upon the output signal of the frequency detector, with the control signal altering the output signal of the oscillator such that the output signal of the oscillator is within a desired frequency band with respect to the reference signal.

15. The phase-lock loop as recited in claim 14, further comprising a frequency divider coupled to receive the output signal of the oscillator, and being configured to divide down a frequency of the output signal of the oscillator by the factor, defining a divided down signal.

16. The phase-lock loop as recited in claim 15, further comprising a phase detector coupled to receive the divided down signal and further coupled to receive the reference signal, and configured to generate an output signal based on a comparison of the phases of the divided down signal and the reference signal, with the output of the phase detector coupled to a further input of the loop filter.

17. The phase-lock loop as recited in claim 16, further comprising a digital-to-analog converter configured to convert the control signal from a digital signal to an analog signal, wherein the converted signal is received by the oscillator.

18. The phase-lock loop as recited in claim 17, wherein the plurality of flip-flops are D flip-flops.

19. The phase-lock loop as recited in claim 18, wherein the reference signal is coupled to a clock input of each flip-flop of the plurality of flip-flops.

20. A wireless device comprising the phase lock loop of claim 14.

21. A method of varying an output signal of an oscillator to be within a desired frequency band with respect to a reference signal, the output signal having a plurality of phases, the method comprising:
comparing the output signal with the reference signal, the comparing comprising:
counting falling edges about each phase of the number of phases in a predetermined time period and summing to define a count output;
comparing the count output with a product of the number of phases of the output signal and a factor to define a comparison;
generating a control signal based upon the comparison; and
inputting the control signal to the oscillator to alter the output signal thereof.

22. The method as recited in claim 21, further including dividing down a frequency of the output signal by the factor.

* * * * *